United States Patent
Su et al.

(10) Patent No.: US 12,113,529 B2
(45) Date of Patent: Oct. 8, 2024

(54) ELECTRONIC DEVICE AND MEMRISTOR-BASED LOGIC GATE CIRCUIT THEREOF

(71) Applicant: SUZHOU METABRAIN INTELLIGENT TECHNOLOGY CO., LTD., Jiangsu (CN)

(72) Inventors: Kang Su, Jiangsu (CN); Fen Guo, Jiangsu (CN); Hongtao Man, Jiangsu (CN); Tuo Li, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/694,941

(22) PCT Filed: Sep. 28, 2022

(86) PCT No.: PCT/CN2022/122300
§ 371 (c)(1),
(2) Date: Mar. 22, 2024

(87) PCT Pub. No.: WO2023/155439
PCT Pub. Date: Aug. 24, 2023

(65) Prior Publication Data
US 2024/0275386 A1   Aug. 15, 2024

(30) Foreign Application Priority Data
Feb. 18, 2022  (CN) .......................... 202210148841.1

(51) Int. Cl.
*H03K 19/20* (2006.01)
*G06F 7/501* (2006.01)
(Continued)

(52) U.S. Cl.
CPC ............. *H03K 19/02* (2013.01); *G06F 7/501* (2013.01); *H03K 19/21* (2013.01)

(58) Field of Classification Search
CPC ......... G06F 7/501; H03K 19/02; H03K 19/21
See application file for complete search history.

(56) References Cited

U.S. PATENT DOCUMENTS

| 11,361,821 B2* | 6/2022 | Syed ........................ G11C 7/04 |
| 2012/0217994 A1* | 8/2012 | Pino ..................... H03K 19/173 |
| | | 326/38 |

(Continued)

FOREIGN PATENT DOCUMENTS

| CN | 105897254 A | 8/2016 |
| CN | 106941350 A | 7/2017 |

(Continued)

*Primary Examiner* — Kurtis R Bahr
(74) *Attorney, Agent, or Firm* — IPro, PLLC

(57) ABSTRACT

An electronic device and a memristor-based logic gate circuit thereof. In the present application, a control end of a controllable switch is connected to a negative end of an output memristor in a MAGIC-based AND logic gate, and whether a second memristor is powered on is controlled by the controllable switch. Thus, when resistance value states of two input memristors in the AND logic gate are different, the controllable switch will conduct and power on the second memristor, and the second memristor will present a low-resistance state at this time. When the resistance value states of the two input memristors are the same, the controllable switch will not conduct and the second memristor will then remain the state unchanged, i.e., presents a high-resistance state. An exclusive OR logic gate is formed by combining the two input memristors and the second memristor.

20 Claims, 1 Drawing Sheet

(51) Int. Cl.
*H03K 19/02* (2006.01)
*H03K 19/21* (2006.01)

(56) References Cited

U.S. PATENT DOCUMENTS

| | | | | |
|---|---|---|---|---|
| 2015/0171868 A1* | 6/2015 | Rodriguez | ..... | H03K 19/017581 |
| | | | | 326/38 |
| 2018/0159536 A1* | 6/2018 | Swartzlander | ..... | G11C 13/0069 |
| 2018/0367149 A1* | 12/2018 | Kvatinsky | .............. | H03K 19/20 |
| 2020/0251526 A1* | 8/2020 | Lesso | ........................ | G06N 3/02 |
| 2023/0170909 A1* | 6/2023 | Kvatinsky | .......... | H03K 19/1776 |
| | | | | 326/39 |

FOREIGN PATENT DOCUMENTS

| CN | 113131928 A | 7/2021 |
|---|---|---|
| CN | 113676176 A | 11/2021 |
| CN | 114204936 A | 3/2022 |

\* cited by examiner

ELECTRONIC DEVICE AND MEMRISTOR-BASED LOGIC GATE CIRCUIT THEREOF

CROSS-REFERENCE TO RELATED APPLICATION

The present application claims the priority of the Chinese patent application filed on Feb. 18, 2022 before the CNIPA, China National Intellectual Property Administration with the application number of 202210148841.1 and the title of "ELECTRONIC DEVICE AND MEMRISTOR-BASED LOGIC GATE CIRCUIT THEREOF", which is incorporated herein in its entirety by reference.

FIELD

The present application relates to the field of memristors, in particular to a memristor-based logic gate circuit, and to an electronic device.

BACKGROUND

The memristor has the characteristics of non-transitory, low power consumption, and simple structure, and has obvious advantages in the aspects of the scalability, compatibility with a CMOS (Complementary Metal Oxide Semiconductor) process, and a response speed. The non-transitory logic unit based on the memristor integrates the functions of calculation and storage and may construct the integrated storage and calculation architecture, which breaks through the "memory wall" problem in the traditional von Neumann architecture.

At present, there are many logic circuits based on the memristors, in which the logic state of a (MAGIC (Memristor-Aided Logic)) circuit composed merely of the memristors may be represented by a resistance value, and the integration of logic operation and storage may be realized. However, the MAGIC logic gate set merely has basic logic gates such as AND, NAND, OR, NOR, etc. The lack of other auxiliary logic gates, such as exclusive OR gates, further affects the design of half adder circuits, limits the application of MAGIC technology, and affects the user experience.

SUMMARY

The object of the present application is to provide a memristor-based logic gate circuit, an exclusive OR logic gate is formed by combining two input memristors and a second memristor in a MAGIC-based AND logic gate, and at the same time, the logic gate circuit may also be used as a half adder, facilitating the application of MAGIC technology and improving user experience; another object of the present application is to provide an electronic device including the above-mentioned memristor-based logic gate circuit, an exclusive OR logic gate is formed by combining two input memristors and the second memristor in the MAGIC-based AND logic gate, and at the same time, the logic gate circuit may also be used as the half adder, facilitating the application of MAGIC technology and improving user experience.

In order to solve the above technical problems, the present application provides a memristor-based logic gate circuit, including:

an AND logic gate based on an auxiliary logic gate MAGIC, used for realizing an operation of logic AND based on three first memristors connected in series within the AND logic gate;

a first power supply, used for outputting electric energy when the AND logic gate is in a steady state;

a second memristor having a first end connected to the first power supply, used for presenting a low-resistance state merely when the first power supply supplies power to itself; and a controllable switch having a first end connected to a second end of the second memristor, a second end being grounded, and a control end connected to a negative end of the first memristor as an output memristor, wherein the controllable switch is used for conducting merely when two first memristors as input memristors in the AND logic gate present different resistance value states.

In some embodiments, the AND logic gate based on the auxiliary logic gate MAGIC includes a second power supply, a first control switch, a first input memristor, a second input memristor, and the output memristor; and the second power supply is connected to a first end of the first control switch, a second end of the first control switch is connected to a negative end of the first input memristor, a positive end of the first input memristor is connected to a negative end of the second input memristor, a positive end of the second input memristor is connected to a negative end of the output memristor, and a positive end of the output memristor is grounded.

In some embodiments, the first power supply includes a power supply unit and a second control switch;

the first power supply is connected to a first end of the second control switch, and a second end of the second control switch is connected to the first end of the second memristor; and the second control switch is used for being controlled to be turned off when the AND logic gate is in the steady state, so that the power supply unit outputs the electric energy.

In some embodiments, the second power supply and the power supply unit are a same power source.

In some embodiments, the first control switch and the second control switch are of a same type.

In some embodiments, the first control switch and the second control switch are both gated switches.

In some embodiments, the controllable switch is an N-type metal-oxide-semiconductor (NMOS).

In order to solve the above technical problems, the present application provides an electronic device, including the above memristor-based logic gate circuit.

The present application provides a memristor-based logic gate circuit, considering that in an AND logic gate based on an auxiliary logic gate MAGIC, the voltage of the negative end of the output memristor will merely present two different voltage levels, i.e., a high voltage level and a low voltage level, and when presenting the high voltage level, the resistance value states of the two input memristors are opposite. Therefore, in the present application, the control end of the controllable switch is connected to the negative end of the output memristor, and whether the second memristor is powered on is controlled by the controllable switch, such that when the resistance value states of the two input memristors in the AND logic gate are different from each other, the controllable switch will conduct and enable the second memristor to be powered on; the second memristor then presents a low-resistance state (representing a logic "1"); when the resistance value state of the two input memristors in the AND logic gate are the same, the controllable switch will not conduct and the second memristor will then remain the state unchanged, i.e. represents a high-resistance state (representing a logic "0"). That is to say, an exclusive OR logic gate is formed by combining the two input memristors and the second memristor, and at the same time, the logic gate circuit may also be used as a half adder, facilitating the application of MAGIC technology and improving user experience.

BRIEF DESCRIPTION OF THE DRAWINGS

In order to provide a clearer explanation of the technical solution in the embodiments of the present application, a brief introduction will be given below to the prior art and the accompanying drawings required in the embodiments. It is evident that the accompanying drawings described below are merely some embodiments of the present application. For those skilled in the art, other accompanying drawings can be obtained based on these drawings without creative labor.

DETAILED DESCRIPTION

The core of the present application is to provide a memristor-based logic gate circuit, an exclusive OR logic gate is formed by combining two input memristors and a second memristor in a MAGIC-based AND logic gate, and at the same time, the logic gate circuit may also be used as a half adder, facilitating the application of MAGIC technology and improving user experience; another object of the present application is to provide an electronic device including the above-mentioned memristor-based logic gate circuit, the exclusive OR logic gate is formed by combining the two input memristors and the second memristor in the MAGIC-based AND logic gate, and at the same time, the logic gate circuit may also be used as the half adder, facilitating the application of MAGIC technology and improving user experience.

In order to clarify the purpose, technical solution, and advantages of the embodiments of the present application, the following will provide a clear and complete description of the technical solution in the embodiments of the present application in conjunction with the accompanying drawings. Obviously, the described embodiments are a part of the embodiments of the present application, not the entire embodiments. Based on the embodiments in the present application, all other embodiments obtained by persons skilled in the art without creative labor fall within the scope of protection of the present application.

Figure 1:
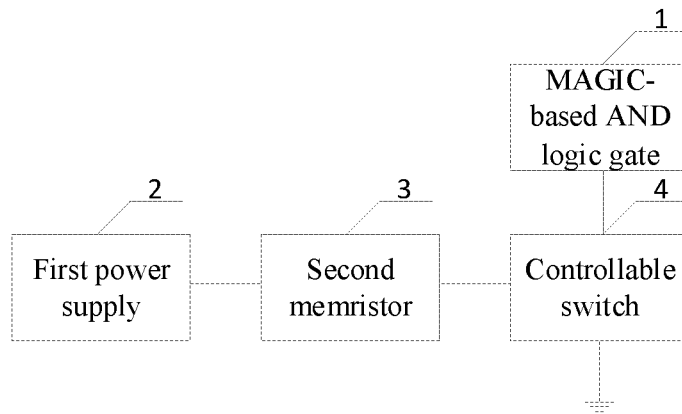
FIG. 1 is a schematic structural diagram of a memristor-based logic gate circuit according to the present application.

Referring to FIG. 1, FIG. 1 is a schematic structural diagram of a memristor-based logic gate circuit according to the present application, and the memristor-based logic gate circuit includes:

an AND logic gate based on an auxiliary logic gate MAGIC, used for realizing an operation of logic AND based on three first memristors connected in series within the AND logic gate;

a first power supply 2, used for outputting electric energy when the AND logic gate is in a steady state;

a second memristor 3 having a first end connected to the first power supply 2, used for presenting a low-resistance state merely when the first power supply 2 supplies power to itself; and a controllable switch 4 having a first end connected to a second end of the second memristor 3, a second end being grounded, and a control end connected to a negative end of the first memristor as an output memristor; where the controllable switch 4 is used for conducting merely when two first memristors as input memristors in the AND logic gate present different resistance value states.

Figure 2:
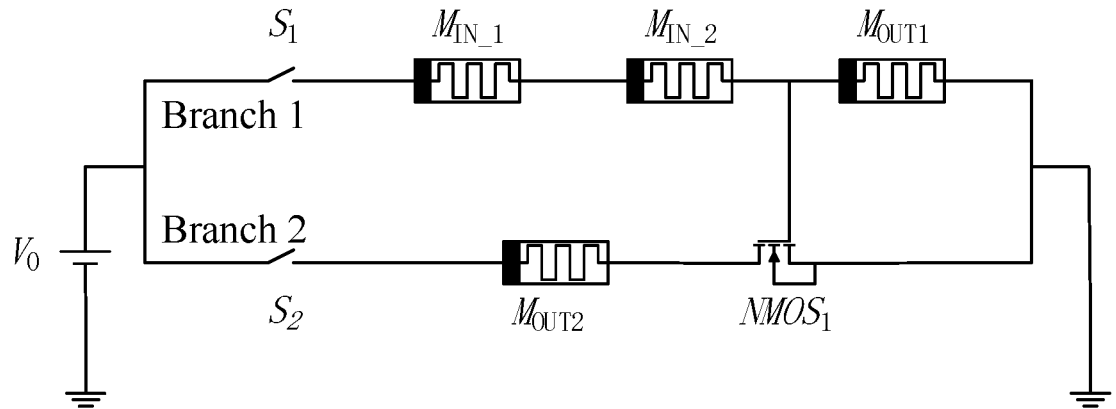
FIG. 2 is a schematic structural diagram of another memristor-based logic gate circuit according to the present application.
Figure 3:
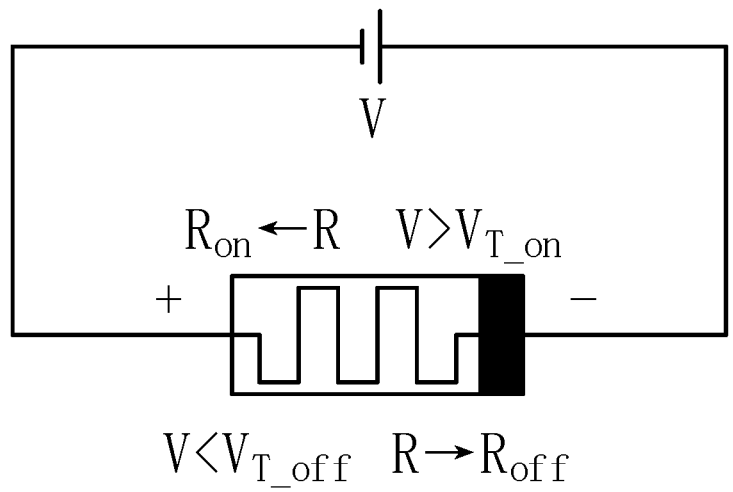
FIG. 3 is a schematic diagram of a resistance of a memristor changing with voltages at two ends.

In order to better explain the embodiments of the present application, reference can be made to FIG. 2 and FIG. 3, FIG. 2 is a schematic structural diagram of another memristor-based logic gate circuit provided in the present application, FIG. 3 is a schematic diagram of a resistance of a memristor changing with voltages at two ends, and FIG. 3 shows how the resistance of the memristor changes with the voltages at the two ends; the working principle of the memristor is that when a certain condition is satisfied, a reversible turnover of two states of a high resistance value and a low resistance value occurs, the high resistance value and the low resistance value may represent two states of "0" and "1" in logic, and the reversible turnover under the condition satisfied ensures a controllable jump between logic states, and after power is removed, the resistance state of the memristor remains stable and has a non-transitory characteristic, therefore, the memristor may satisfy the implementation of a non-transitory logic function. Non-transitory logic operations based on the memristor have great potential value in the field of computing.

The memristors used in the embodiments of the present application are all threshold-type memristors, namely, two types of threshold voltages are required to change the corresponding boundary resistance. For example, the two boundary resistances $R_{on}$ and $R_{off}$ ($R_{off} \gg R_{on}$) represent logic "1" and "0", respectively, the voltage required to be applied to change the memristor from logic "0" to logic "1" should be greater than or equal to the threshold voltage $V_{T\text{-}ON}$, and the voltage required to be applied to change the memristor from logic "1" to logic "0" should be less than or equal to the threshold voltage $V_{T\text{-}OFF}$.

In some embodiments, in FIG. 2, $M_{in1}$ and $M_{in2}$ are two input memristors in the AND logic gate, $M_{out1}$ is an output memristor, the controllable switch 4 is $NMOS_1$, and the second memristor 3 is $M_{out2}$.

The "exclusive OR" gate circuit and the half adder circuit based on the memristor MAGIC logic proposed in the present application are improved and optimized on the basis of the "AND" gate circuit of the MAGIC logic. Therefore, the "AND" gate circuit of the MAGIC logic is first built, namely, the voltage sources $V_0$, $M_{in1}$, $M_{in2}$, and $M_{out1}$ are connected in series, and the operation process of realizing the "AND" logic is as follows:

(1) setting an initial state, and setting the resistance value of the output memristor MOUT1 as $R_{off}$, namely, the logic state is "0";

(2) setting a corresponding input state for two input memristors;

(3) switch $S_1$ is closed and voltage $V_0$ is applied to branch 1.

The above operation process may complete the logical operation of the AND gate. Assuming that the two logic values of the input signal are "00", the corresponding input memristor resistance values are both $R_{off}$, and at this time, the two input memristors and the output memristor $M_{out1}$ are connected in series, and the resistance values are both $R_{off}$. Therefore, the voltage at the two ends of the output memristor $M_{out1}$ is $V_0/3$, which does not reach the threshold voltage at which the output memristor $M_{out1}$ transitions from $R_{off}$ to $R_{on}$, so the logic state of the output memristor $M_{out1}$ is still "0". Similarly, when the logic value of the input signal is "10" or "01", the voltage at the two ends of the output memristor $M_{out1}$ is $$\frac{R_{off} V_0}{2R_{off} + R_{on}},$$

approximately $V_0/2$, and the voltages at the two ends of the output memristor $M_{out1}$ in both cases are less than $V_{T\_ON}$, which do not reach the threshold voltage at which the output memristor $M_{out1}$ transitions from $R_{off}$ to $R_{on}$, so the logic state of the output memristor $M_{out1}$ is still "0". Merely when the input logic is "11", the voltage at the two ends of the output memristor $M_{out1}$ is $$\frac{R_{off} V_0}{R_{off} + 2R_{on}},$$

which is greater than $V_{T\_ON}$, thereby enabling the output logic to transition from "0" to "1". The inputs and outputs of the above signals correspond to the truth table of the AND gate, thereby realizing the function of the AND logic gate. The truth table of the AND logic gates is shown in Table 1.

TABLE 1

| Input A | Input B | A AND B | A XOR B |
|---------|---------|---------|---------|
| 0 | 0 | 0 | 0 |
| 0 | 1 | 0 | 1 |
| 1 | 0 | 0 | 1 |
| 1 | 1 | 1 | 0 |

Wherein, in the AND logic gate of FIG. 2, $$\frac{R_{off} V_0}{2R_{off} + R_{on}} < V_{T\_ON} < \frac{R_{off} V_0}{R_{off} + 2R_{on}};$$

Since $R_{off} \gg R_{on}$, the value range of $V_0$ is:

$V_{T\_ON} < V_0 < 2V_{T\_ON}$;

the threshold voltage $V_{TH}$ of the above-mentioned NMOS (N-type metal-oxide-semiconductor) ranges from:

$V_0/3 < V_{TH} < V_0/2$;

wherein $V_0$ is the nominal voltage of the first power supply 2.

In some embodiments, the "exclusive OR" logic operation is performed after the "AND" logic operation is finished, namely, after the voltages at each end of branch 1 are stabilized. The operation process of realizing "exclusive OR" logical operation is as follows:
  (1) setting an initial state, and setting the resistance value of the output memristor $M_{OUT2}$ as $R_{off}$, namely, the logic state is "0", and this step can be performed simultaneously with step (1) in the above-mentioned AND logic operation;
  (2) switch $S_2$ is turned off and voltage $V_0$ is applied to branch 2.

The above operation process may complete the logical operation of the "exclusive OR" gate. Assuming that the two logic values of the input signal are "00", the logic state of the "AND" logic output memristor $M_{out1}$ is still "0", at this moment, the voltage value at two ends of the $M_{out1}$ is $V_0/3$, which is less than the threshold voltage of the NMOS, the source and drain of the NMOS are in an off state, and the logic state of the output memristor $M_{out2}$ is still "0" unchanged; when the two logic values of the input signal are "11", then the final logic state of the "AND" logic output memristor $M_{out1}$ is "1", at this moment, the voltage value at two ends of the $M_{out1}$ is $V_0/3$, which is still less than the threshold voltage of the NMOS, the source and drain of the NMOS are in an off state, and the logic state of the output memristor $M_{out2}$ remains "0" unchanged; when the two logic values of the input signal are "10" or "01", the logic state of the "AND" logic output memristor $M_{out1}$ is "0", at this moment, the voltage value at two ends of the $M_{out1}$ is $$\frac{R_{off} V_0}{2R_{off} + R_{on}},$$

approximately $V_0/2$, which is greater than the threshold voltage of the NMOS, the source and drain of the NMOS are in a conduction state, and the voltage at two ends of the output memristor $M_{out2}$ is $V_0$, which is greater than $V_{T\_ON}$, so as to realize that the logic of the output memristor $M_{out2}$ is converted from "0" to "1". The inputs and outputs of the above signals correspond to the truth table of the "exclusive OR" gate, thereby implementing the function of the "exclusive OR" logic gate. The "exclusive OR" logic gate truth table is shown in Table 1.

The logical expression for a half adder is:

$S = A \oplus B$;

$C = A \cdot B$;

where A and B are addends (inputs), S is a sum, and C is the carry towards a high position. According to the logic expression of the half adder, it can be seen that the two output ends of the half adder are the "exclusive OR" and "AND" logic operation results of the two input ends respectively. Therefore, the circuit designed by the embodiments of the present application can also be used as a half adder circuit.

The present application provides a memristor-based logic gate circuit, considering that in an AND logic gate based on an auxiliary logic gate MAGIC, the voltage of the negative end of the output memristor will merely present two different voltage levels, i.e., a high voltage level and a low voltage level, and when presenting the high voltage level, the resistance value states of the two input memristors are opposite. Therefore, in the present application, the control end of the controllable switch is connected to the negative end of the output memristor, and whether the second memristor is powered on is controlled by the controllable switch, such that when the resistance value states of the two input memristors in the AND logic gate are different from each other, the controllable switch will conduct and enable the second memristor to be powered on; the second memristor then presents a low-resistance state (representing a logic "1"); when the resistance state the resistance value states of the two input memristors in the AND logic gate are the same, the controllable switch will not conduct and the second memristor will then remain the state unchanged, i.e. represents a high-resistance state (representing a logic "0"). That is to say, an exclusive OR logic gate is formed by combining the two input memristors and the second memristor, and at the same time, the logic gate circuit can also be used as a half adder, facilitating the application of MAGIC technology and improving user experience.

On the basis of the above embodiments:

in some embodiments, the AND logic gate based on the auxiliary logic gate MAGIC includes a second power supply, a first control switch $S_1$, a first input memristor, a second input memristor, and an output memristor;

the second power supply is connected to a first end of the first control switch $S_1$, a second end of the first control switch $S_1$ is connected to a negative end of the first input memristor, a positive end of the first input memristor is connected to a negative end of the second input memristor, a positive end of the second input memristor is connected to a negative end of the output memristor, and a positive end of the output memristor is grounded.

In some embodiments, the MAGIC-based AND logic gate 1 may have other configurations in addition to the specific configuration, and the embodiment of the present application is not limited thereto.

In some embodiments, the first power supply 2 includes a power supply unit $V_0$ and a second control switch $S_2$;

the first power supply 2 is connected to a first end of the second control switch $S_2$, and a second end of the second control switch $S_2$ is connected to a first end of the second memristor 3;

the second control switch is used for being controlled to be turned off when the AND logic gate is in a steady state so that the power supply unit $V_0$ outputs electric energy.

In some embodiments, in the embodiment of the present application, whether the power supply unit $V_0$ outputs the electric energy or not may be controlled by the second control switch $S_2$, and the function of the second control switch $S_2$ is to prevent the influence on the voltage of the control end of the controllable switch 4 caused by the unstable voltage at each endpoint in the branch 1 at the moment when the first control switch $S_1$ is turned off, thereby resulting in the misoperation of on and off states of the controllable switch 4.

In some embodiments, the first power supply 2 in the embodiment of the present application has the advantages of simple structure and low cost.

Certainly, the first power supply 2 may be of other types than the specific configuration, and the embodiment of the present application is not limited thereto.

In some embodiments, the second power supply is the same power supply as the power supply unit $V_0$.

In some embodiments, designing the second power supply to be the same power supply as the power supply unit $V_0$ may simplify the structure and reduce the cost.

Certainly, the second power supply and the power supply unit $V_0$ may be independent power sources, and the embodiment of the present application is not limited herein.

In some embodiments, the first control switch $S_1$ and the second control switch $S_2$ are of the same type.

In some embodiments, designing the first control switch $S_1$ and the second control switch $S_2$ to be the same type may simplify the structure and reduce the cost.

Certainly, the first control switch $S_1$ and the second control switch $S_2$ may be of different types, and the embodiment of the present application is not limited thereto.

In some embodiments, the first control switch $S_1$ and the second control switch $S_2$ are gated switches.

In some embodiments, the gated switch has the advantages of high automation and long life.

Certainly, in addition to the gated switch, the first control switch $S_1$ and the second control switch $S_2$ may be of other types, and the embodiment of the present application is not limited thereto.

In some embodiments, the controllable switch 4 is an N-type metal-oxide-semiconductor (NMOS).

In some embodiments, NMOS has the advantages of small size, fast response, and long life.

Certainly, the controllable switch 4 may be of other types than NMOS, and the embodiments of the present application are not limited herein.

The present application also provides an electronic device including a memristor-based logic gate circuit as in the previous embodiments.

For a description of the electronic devices provided by the embodiments of the present application, reference is made to the aforementioned embodiments of the memristor-based logic gate circuit, and the embodiments of the present application will not be described in detail herein.

The embodiments in the specification are described in a progressive manner, and each embodiment focuses on the differences from other embodiments. The same and similar parts between the embodiments can be referred to each other. It should also be noted that in the specification, relational terms such as first and second are merely used to distinguish one entity or operation from another entity or operation, and do not necessarily require or imply any actual relationship or order between these entities or operations. Moreover, the terms "including", "comprising", or any other variation thereof are intended to encompass non-exclusive inclusion, such that a process, method, item, or device that includes a series of elements not merely includes those elements, but also includes other elements that are not explicitly listed, or also includes elements inherent to such process, method, item, or device. Without further limitations, the element limited by the statement "including one . . . " does not exclude the existence of another identical element in the process, method, item, or device that includes that element.

The above explanation of the disclosed embodiments enables persons skilled in the art to implement or use the present application. The various modifications to these embodiments will be apparent to persons skilled in the art, and the general principles defined in the specification can be implemented in other embodiments without departing from the spirit or scope of the present application. Therefore, the present application will not be limited to the embodiments shown herein, but rather to the widest scope consistent with the principles and novel features disclosed herein.

The invention claimed is:

1. A memristor-based logic gate circuit, comprising:
an AND logic gate based on a memristor-aided logic (MAGIC) auxiliary logic gate, used for realizing an operation of logic AND based on three first memristors connected in series within the AND logic gate;
a first power supply, used for outputting electric energy when the AND logic gate is in a steady state;
a second memristor having a first end connected to the first power supply, used for presenting a low-resistance state merely when the first power supply supplies power to itself; and
a controllable switch having a first end connected to a second end of the second memristor, a second end being grounded, and a control end connected to a negative end of the first memristor as an output memristor, wherein the controllable switch is used for conducting merely when two first memristors as input memristors in the AND logic gate present different resistance value states.

2. The memristor-based logic gate circuit according to claim 1, wherein the AND logic gate based on the auxiliary logic gate MAGIC comprises a second power supply, a first control switch, a first input memristor, a second input memristor, and the output memristor; and the second power supply is connected to a first end of the first control switch, a second end of the first control switch is connected to a negative end of the first input memristor, a positive end of the first input memristor is connected to a negative end of the second input memristor, a positive end of the second input memristor is connected to a negative end of the output memristor, and a positive end of the output memristor is grounded.

3. The memristor-based logic gate circuit according to claim 2, wherein the output memristor presents a high-resistance state in an initial state.

4. The memristor-based logic gate circuit according to claim 2, wherein the first power supply comprises a power supply unit and a second control switch;

the first power supply is connected to a first end of the second control switch, and a second end of the second control switch is connected to the first end of the second memristor; and the second control switch is used for being controlled to be turned off when the AND logic gate is in the steady state, so that the power supply unit outputs the electric energy.

5. The memristor-based logic gate circuit according to claim 4, wherein the second power supply and the power supply unit are a same power source.

6. The memristor-based logic gate circuit according to claim 4, wherein the first control switch and the second control switch are of a same type.

7. The memristor-based logic gate circuit according to claim 6, wherein the first control switch and the second control switch are both gated switches.

8. The memristor-based logic gate circuit according to claim 4, wherein the first control switch and the second control switch are of different types.

9. The memristor-based logic gate circuit according to claim 4, wherein the second power supply and the power supply unit are mutually independent power sources.

10. The memristor-based logic gate circuit according to claim 1, wherein the controllable switch is an N-type metal-oxide-semiconductor (NMOS).

11. The memristor-based logic gate circuit according to claim 10, wherein a threshold voltage of the N-type metal-oxide-semiconductor (NMOS) is greater than one third of a nominal voltage of the first power supply and less than a half of the nominal voltage of the first power supply.

12. The memristor-based logic gate circuit according to claim 10, wherein a drain electrode of the N-type metal-oxide-semiconductor (NMOS) is connected to the second end of the second memristor, a source electrode of the N-type metal-oxide-semiconductor (NMOS) is grounded, and a gate electrode of the N-type metal-oxide-semiconductor (NMOS) is connected to the negative end of the first memristor as the output memristor.

13. The memristor-based logic gate circuit according to claim 1, wherein the first memristor and the second memristor are of a same type.

14. The memristor-based logic gate circuit according to claim 13, wherein the first memristor and the second memristor are threshold-type memristors.

15. The memristor-based logic gate circuit according to claim 14, wherein a voltage of the first power supply is greater than a first threshold voltage of the threshold memristor and less than twice the first threshold voltage of the threshold-type memristor; and the first threshold voltage of the threshold-type memristor is a voltage threshold at which the threshold-type memristor transitions from a low-resistance state to a high-resistance state.

16. The memristor-based logic gate circuit according to claim 1, wherein the second memristor presents a high-resistance state in an initial state.

17. The memristor-based logic gate circuit according to claim 1, wherein the memristor-based logic gate circuit is configured to form a half adder circuit.

18. The memristor-based logic gate circuit according to claim 17, wherein a sum of outputs of the half adder circuit is a sum of exclusive OR operations of logic states corresponding to the resistance value states of the two first memristors as the input memristors.

19. The memristor-based logic gate circuit according to claim 17, wherein a carrying value of the half adder circuit is a dot product of logic states corresponding to the resistance value states of the two first memristors as the input memristors.

20. An electronic device, comprising a memristor-based logic gate circuit, wherein the memristor-based logic gate circuit includes:

an AND logic gate based on a memristor-aided logic (MAGIC) auxiliary logic gate, used for realizing an operation of logic AND based on three first memristors connected in series within the AND logic gate;

a first power supply, used for outputting electric energy when the AND logic gate is in a steady state;

a second memristor having a first end connected to the first power supply, used for presenting a low-resistance state merely when the first power supply supplies power to itself; and a controllable switch having a first end connected to a second end of the second memristor, a second end being grounded, and a control end connected to a negative end of the first memristor as an output memristor, wherein the controllable switch is used for conducting merely when two first memristors as input memristors in the AND logic gate present different resistance value states.

\* \* \* \* \*